United States Patent
Yagishita et al.

(10) Patent No.: US 6,654,298 B2
(45) Date of Patent: Nov. 25, 2003

(54) SEMICONDUCTOR MEMORY DEVICE

(75) Inventors: Yoshimasa Yagishita, Kawasaki (JP); Toshiya Uchida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/988,614

(22) Filed: Nov. 20, 2001

(65) Prior Publication Data

US 2002/0141262 A1 Oct. 3, 2002

(30) Foreign Application Priority Data

Mar. 29, 2001 (JP) ........................................ 2001-096344

(51) Int. Cl.$^7$ .......................... G11C 7/00; G11C 29/00; G11C 8/00
(52) U.S. Cl. .................. 365/200; 365/207; 365/189.01; 365/189.11; 365/189.05; 365/230.06; 365/230.08
(58) Field of Search ............................ 365/200, 189.01, 365/189.11, 201, 230.06, 230.08, 189.05

(56) References Cited

U.S. PATENT DOCUMENTS

| 5,491,655 | A | * | 2/1996 | Hirose et al. | 365/177 |
| 6,104,648 | A | * | 8/2000 | Ooishi | 365/200 |
| 6,188,597 | B1 | * | 2/2001 | Takita et al. | 365/200 |
| 6,246,614 | B1 | * | 6/2001 | Ooishi | 365/191 |
| 6,304,501 | B2 | * | 10/2001 | Ooishi | 365/200 |
| 6,314,033 | B1 | * | 11/2001 | Sugamoto et al. | 365/189.01 |
| 6,418,066 | B1 | * | 7/2002 | Hidaka | 365/198 |

FOREIGN PATENT DOCUMENTS

JP 2001297595 A * 10/2001 .......... G11C/29/00

\* cited by examiner

Primary Examiner—David Nelms
Assistant Examiner—Ly Duy Pham
(74) Attorney, Agent, or Firm—Arent Fox Kintner Plotkin & Kahn, PLLC

(57) ABSTRACT

A semiconductor memory device that reduces the probability of the penalties of wirings arising. An address input circuit receives an address signal input. A drive circuit drives a memory array in compliance with the address signal. A signal line connects the address input circuit and the drive circuit. A redundant circuit is located near the drive circuit and substitutes other lines including a redundant line for a defective line in the memory array. A defective line information store circuit stores information showing the defective line. A supply circuit supplies information stored in the defective line information store circuit to the redundant circuit via the signal line. This structure enables to transmit an address signal and information regarding a defective line by a common signal line and to reduce the number of wirings and the probability of the penalties of wirings arising.

2 Claims, 14 Drawing Sheets

SEMICONDUCTOR MEMORY DEVICE

BACKGROUND OF THE INVENTION (1) Field of the Invention

This invention relates to a semiconductor memory device and, more particularly, to a semiconductor memory device having a shift redundancy function.

(2) Description of the Related Art

If there is a defective line in a semiconductor memory device manufactured, it can be returned to normal by substituting other lines including a redundant line for the defective line by the use of a technique called shift redundancy.

FIG. 9 is a view for giving an overview of shift redundancy. In FIG. 9, a memory array 2 includes an ordinary line 2a and redundant line 2b. How to connect them is managed by a decoder 1.

As shown in FIG. 10, it is assumed that a defective line is detected in the middle area of this semiconductor memory device. Then the decoder 1 can substitute other lines including the redundant line for the defective line by shifting all of the lines being on the right-hand side of the defective line to the right.

FIG. 11 is a circuit diagram for realizing this shift redundancy. In FIG. 11, an address latch circuit 20 latches an address signal input from the outside and provides it to a decoding circuit 21.

The decoding circuit 21 decodes an address signal latched by the address latch circuit 20, generates a selection signal for selecting a predetermined line in a memory array, and provides it to a word driver circuit 22.

The word driver circuit 22 drives the memory array in compliance with a selection signal supplied from the decoding circuit 21.

A fuse circuit 23 includes fuses the number of which corresponds to that of word lines in the memory array. If tests run after manufacture show that a predetermined word line in the memory array is defective, information showing the defective line will be stored by blowing fuses corresponding to the position (address) of the defective line by the use of an external unit.

A decoding circuit 24 decodes information showing a defective line held in the fuse circuit 23, generates an indicating signal that indicates the defective line from among word lines, and provides it to a redundant circuit 25.

The redundant circuit 25 controls the word driver circuit 22 in compliance with an indicating signal and substitutes other lines including a redundant line for a defective line.

Operation in the above conventional semiconductor memory device will now be described.

If tests run after manufacture show that a predetermined word line in the memory array is defective, a fuse in the fuse circuit 23 corresponding to the defective line will be blown.

It is assumed that a semiconductor memory device in which fuses corresponding to a defective line have been blown in this way is mounted in a predetermined circuit and that power is applied to it. First, the fuse circuit 23 generates a signal corresponding to how fuses are blown (address signal showing the defective line) and provides it to the decoding circuit 24.

The decoding circuit 24 decodes the signal supplied from the fuse circuit 23, generates an indicating signal, and provides it to the redundant circuit 25.

The redundant circuit 25 refers to the indicating signal supplied from the decoding circuit 24, shifts word lines by controlling the word driver circuit 22, and substitutes other lines including a redundant line for the defective line (see FIG. 10).

When the shift redundancy is completed, the semiconductor memory device begins to accept an address signal and the address latch circuit 20 latches an address signal input.

The decoding circuit 21 decodes the address signal latched by the address latch circuit 20, generates a selection signal, and provides it to the word driver circuit 22.

The word driver circuit 22 has performed shift redundancy on the basis of instructions from the redundant circuit 25, so the word driver circuit 22 properly shifts the selection signal supplied from the decoding circuit 21 and provides it to the memory array. This can exclude the defective line from lines to be accessed and substitute the redundant line for the defective line.

FIG. 12 is a view for giving an overview of a circuit pattern formed in the case of the circuit shown in FIG. 11 being mounted on a semiconductor substrate. In this example, the decoding circuit and fuse circuit are located along a side of the memory array. Hatched areas in the decoding circuit are the redundant circuits. Each of the right and left halves of the memory array is a redundancy unit. If a defective line exists in each unit, the operation in each unit of substituting a redundant line for a defective line will be performed independently.

As stated above, if there is a one-to-one relationship between a memory array on which shift redundancy is performed and a fuse circuit, the only thing to do is to newly add a block corresponding to a redundant line. Shift redundancy therefore can be realized easily.

As shown in FIG. 11, to realize shift redundancy, selection wirings for shift redundancy must be formed separately from ordinary selection wirings. There are many wirings especially after the decoding circuit 21 and redundant circuit 25, so the penalties of wirings can arise, depending on a circuit layout.

Furthermore, as shown in FIG. 13, with a semiconductor memory device, such as a fast cycle random access memory (FCRAM), consisting of a plurality of subblocks, there is a technique in which the plurality of subblocks share a fuse. In this case, "subblock" is a memory array unit including one redundant line. In this example, hatched areas are redundant circuits, so there are two subblocks in the horizontal and vertical directions respectively. That is to say, this semiconductor memory device consists of a total of 4 (=2×2) subblocks.

In this example, two subblocks located in the vertical direction share one fuse circuit. Therefore, as shown in FIG. 14, if there is a defective line in one of the two subblocks located in the vertical direction, shift redundancy is performed on both of them. In this example, the fourth line from the left and the rightmost line are defective ones. The leftmost redundant lines in the left and right subblocks are substituted for these defective lines.

If a plurality of subblocks located in the vertical direction share the same fuse circuit in this way, a decoding circuit in each subblock and the fuse circuit must be connected with a wiring. Therefore, as shown in FIGS. 13 and 14, some of these wirings must pass over a subblock, resulting in a stronger probability of the penalties of wirings arising and difficulty in a decoder layout.

With a memory layout of a spread type, memory arrays located in the vertical direction can share a fuse circuit. In this case, there is no need to locate lines over a memory array. However, this technique is not applicable to cases where more than two memory arrays exist.

SUMMARY OF THE INVENTION

In order to address such problems, the present invention was made. An object of the present invention is to reduce the probability of the penalties of wirings arising and to make the arrangement of recorders easy, especially in a semiconductor memory device having a plurality of subblocks.

In order to achieve the above object, a semiconductor memory device having a shift redundancy function is provided. This semiconductor memory device comprises an address input circuit for receiving an address signal input, a drive circuit for driving a memory array in compliance with the address signal, a signal line for connecting the address input circuit and the drive circuit, a redundant circuit located near the drive circuit for substituting other lines including a redundant line for a defective line in the memory array, a defective line information store circuit for storing information showing the defective line, and a supply circuit for supplying information stored in the defective line information store circuit to the redundant circuit via the signal line.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Embodiments of the present invention will now be described with reference to the drawings.

Figure 1:
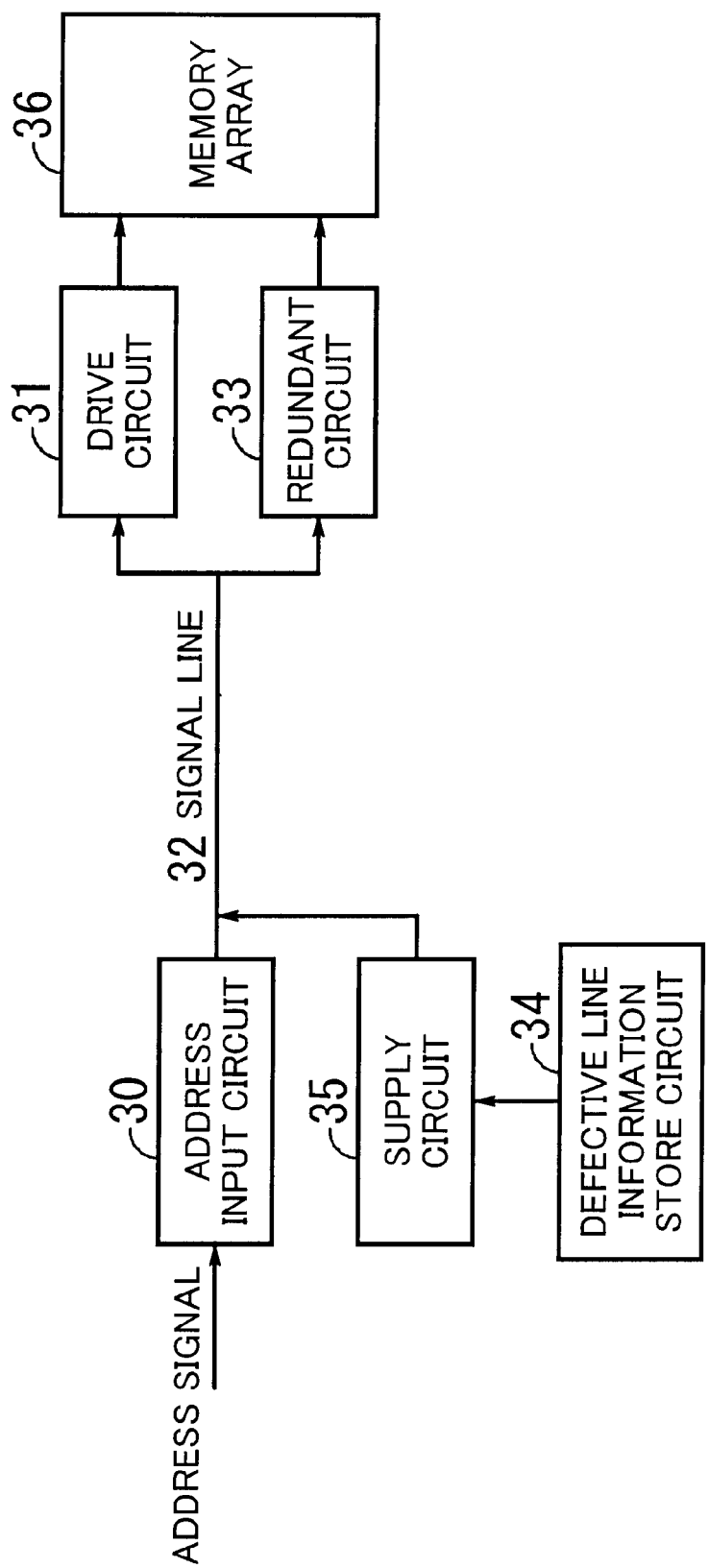
FIG. 1 is a view for describing the operative principles of the present invention.

FIG. 1 is a view for describing the operative principles of the present invention. As shown in FIG. 1, a semiconductor memory device according to the present invention comprises an address input circuit 30, a drive circuit 31, a signal line 32, a redundant circuit 33, a defective line information store circuit 34, a supply circuit 35, and a memory array 36.

The address input circuit 30 receives an address signal input from the outside and provides it to the drive circuit 31 via the signal line 32.

The drive circuit 31 drives the memory array 36 in compliance with an address signal supplied via the signal line 32.

The signal line 32 electrically connects the address input circuit 30 and drive circuit 31 to transmit an address signal.

The redundant circuit 33 is located near the drive circuit 31 and performs the process of substituting other lines including a redundant line for a defective line in the memory array 36.

The defective line information store circuit 34 stores information showing a defective line in the memory array 36.

The supply circuit 35 supplies information showing a defective line, which is stored in the defective line information store circuit 34, to the redundant circuit 33 via the signal line 32.

Now, operation in FIG. 1 will be described.

If tests show that there exists a defective line in the memory array 36, information for specifying the defective line is stored in the defective line information store circuit 34 by another device. The defective line information store circuit 34 has a plurality of fuses. Information regarding the defective line is stored by blowing a fuse corresponding to the position of the defective line.

It is assumed that information showing a defective line is stored in the defective line information store circuit 34 in this way and that the semiconductor memory device is mounted in a predetermined circuit.

In this state of things, it is assumed that power is applied to that circuit. Then the supply circuit 35 in the semiconductor memory device reads information regarding the defective line from the defective line information store circuit 34 and provides it to the redundant circuit 33 via the signal line 32. At this time, the operation of the address input circuit 30 will be stopped and the inputting of an address signal will be stopped.

The redundant circuit 33 performs the process of substituting other lines including a redundant line for the defective line in the memory array 36 on the basis of the information supplied via the signal line 32.

Moreover, the redundant circuit 33 has a memory circuit therein and can store information regarding a defective line. Therefore, after the information is supplied from the supply circuit 35, the redundant circuit 33 can perform the redundant process continuously on the basis of the information it stored.

When the redundant process is completed, the address input circuit 30 will begin to receive an address signal input from the outside. An address signal input from the address input circuit 30 is provided to the drive circuit 31 via the signal line 32.

The drive circuit 31 drives the memory array 36 on the basis of the address signal supplied via the signal line 32. Shift redundancy has been completed then by the redundant circuit 33, so the defective line will be excluded from lines to be accessed.

As described above, in the present invention, information regarding a defective line is supplied from the defective line information store circuit 34 to the redundant circuit 33 at the time of a semiconductor memory device being started by the use of the signal line 32 for supplying an address signal to the drive circuit 31. This enables to reduce the number of wirings and the probability of the penalties of wirings arising in comparison to conventional semiconductor memory devices.

Furthermore, at the time of a semiconductor memory device being started, information is supplied from the defective line information store circuit 34 to the redundant circuit 33 and is stored there. Therefore, it is enough just to provide information to the redundant circuit 33 once after a semiconductor memory device being started. This will lead to simple operation of a semiconductor memory device.

Figure 2:
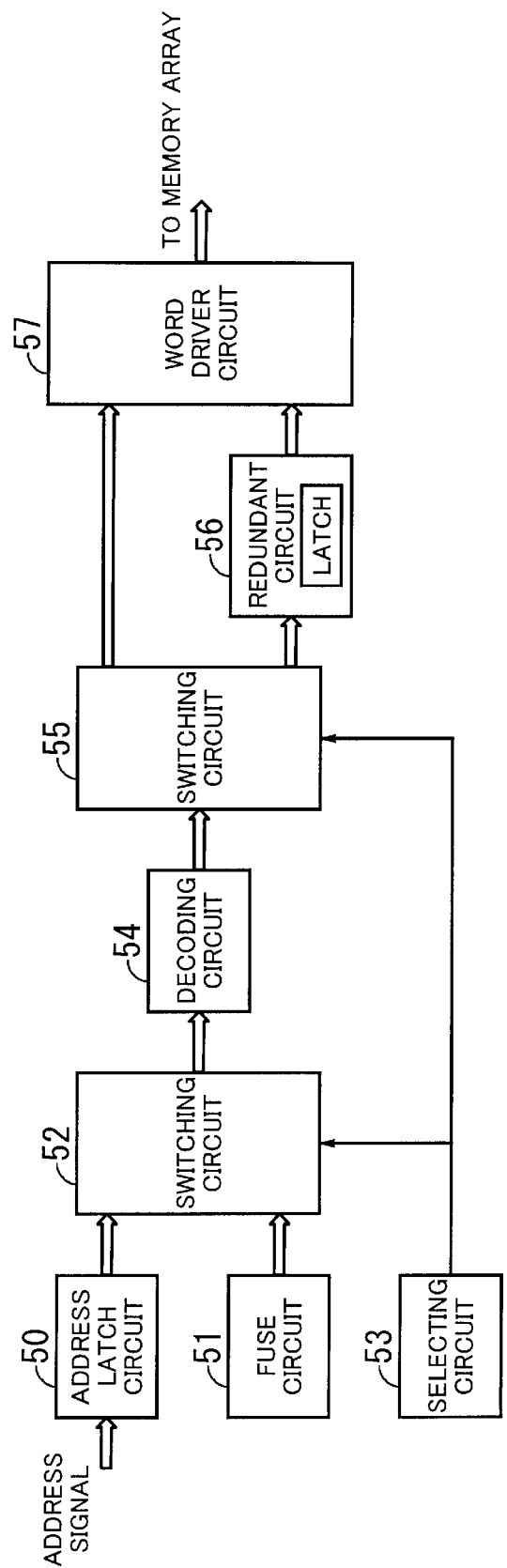
FIG. 2 is a view showing the structure of a first embodiment of the present invention.

FIG. 2 is a view showing the structure of an embodiment of the present invention. As shown in FIG. 2, a semiconductor memory device according to the present invention comprises an address latch circuit 50, a fuse circuit 51, a switching circuit 52, a selecting circuit 53, a decoding circuit 54, a switching circuit 55, a redundant circuit 56, a word driver circuit 57, and a memory array (not shown).

The address latch circuit 50 latches an address signal supplied from the outside and provides it to the switching circuit 52.

The fuse circuit 51 consists of a plurality of fuses. Information showing whether a defective line exists and information for specifying a defective line are held by these fuses.

The switching circuit 52 selects output from the address latch circuit 50 or output from the fuse circuit 51 under the control of the selecting circuit 53 and provides it to the decoding circuit 54.

At the time of the semiconductor memory device being started, the selecting circuit 53 provides a signal that instructs to select output from the fuse circuit 51 to the switching circuit 52 and switching circuit 55. After a redundant process is completed, the selecting circuit 53 provides a signal that instructs to select output from the address latch circuit 50 to the switching circuit 52 and switching circuit 55.

The decoding circuit 54 decodes an address signal supplied from the address latch circuit 50 or fuse circuit 51, generates a selection signal for selecting a word line, and outputs it.

The switching circuit 55 provides output from the decoding circuit 54 to the word driver circuit 57 or redundant circuit 56 in compliance with instructions given by the selecting circuit 53.

The redundant circuit 56 has a latch circuit therein and stores information obtained by the decoding circuit 54 decoding a signal output from the fuse circuit 51. Moreover, the redundant circuit 56 controls the word driver circuit 57 on the basis of this information and performs the redundant process of substituting other lines including a redundant line for a defective line.

The word driver circuit 57 performs a redundant process under the control of the redundant circuit 56 and controls the memory array in compliance with a selection signal obtained by the decoding circuit 54 decoding a signal output from the address latch circuit 50.

Now, operation in the above embodiment will be described.

If tests etc. before shipping show that there is a defective line in a memory array, a predetermined fuse in the fuse circuit 51 corresponding to the position of the defective line will be blown. The fuse circuit 51 includes a fuse showing whether there exists a defective line and a group of fuses for specifying the address of a defective line. If a defective line is detected, then the above word line showing whether there exists a defective line is blown and the above group of fuses are blown according to a predetermined pattern corresponding to the position of the defective line (pattern corresponding to a binary number which represents an address value, for example).

In this state of things, it is assumed that the semiconductor memory device is mounted in a predetermined circuit and that power is applied to that circuit. Then the selecting circuit 53 instructs the switching circuit 52 and switching circuit 55 to select output from the fuse circuit 51.

Figure 3:
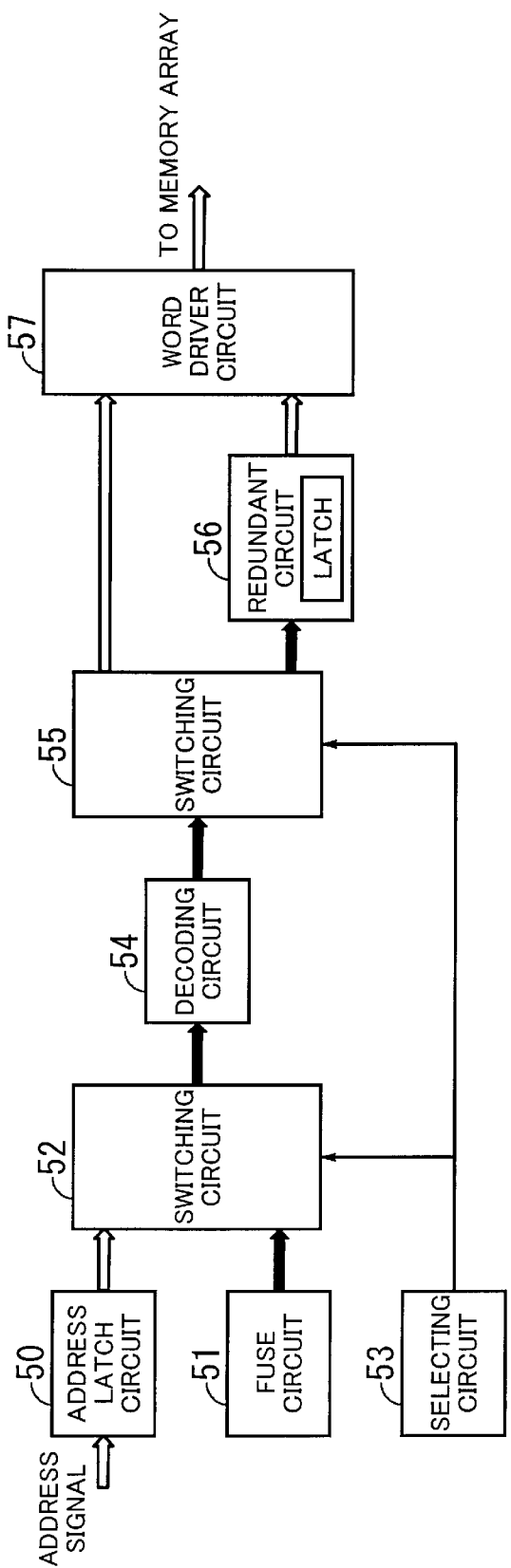
FIG. 3 is a view for describing operation in the first embodiment shown in FIG. 2.

As a result, output from the fuse circuit 51 is selected by the switching circuit 52, is provided to the decoding circuit 54, is decoded there to convert into a selection signal, and is provided to the redundant circuit 56 by the switching circuit 55. This is shown in FIG. 3 by thick lines.

The redundant circuit 56 latches and holds the selection signal for redundancy supplied from the switching circuit 55 in the internal latch circuit. The selection signal latched in this way in the latch circuit will remain held until power is turned off.

After the selection signal is provided to the redundant circuit 56, the selecting circuit 53 instructs the switching circuit 52 and switching circuit 55 to select output from the address latch circuit 50.

Figure 4:
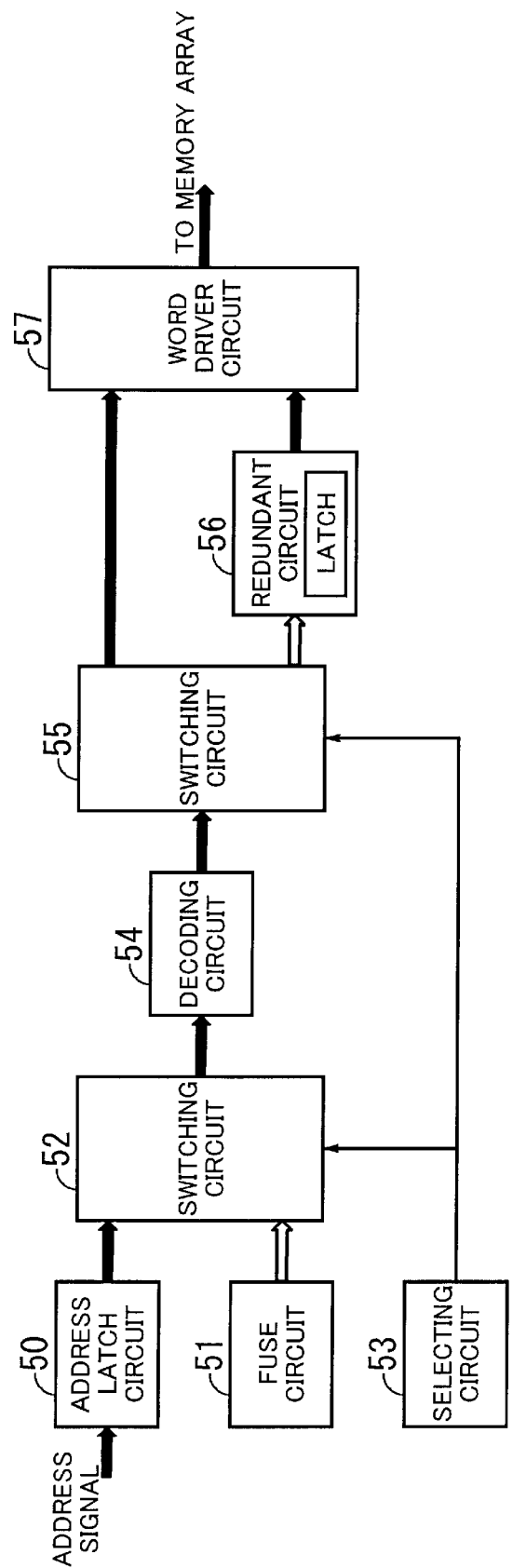
FIG. 4 is a view for describing operation in the first embodiment shown in FIG. 2.

As a result, the address latch circuit 50 latches an address signal supplied from the outside and provides it to the decoding circuit 54 via the switching circuit 52. This is shown in FIG. 4 by thick lines.

The decoding circuit 54 decodes the address signal to generate a selection signal and outputs it to the switching circuit 55.

The switching circuit 55 provides the output from the decoding circuit 54 to the word driver circuit 57 in compliance with instructions from the selecting circuit 53.

By the way, the word driver circuit 57 has performed a redundant process under the control of the redundant circuit 56, so other lines including the redundant line have been substituted for the defective line. As a result, if a selection signal that selects the defective line is input, a substitute line for the defective one will be accessed.

As described above, when a semiconductor memory device according to the present invention is started, information regarding a defective line stored in the fuse circuit 51 is provided to the redundant circuit 56 by the use of a path along which an ordinary address is transmitted. This enables to reduce the number of wirings, resulting in a lower probability of the penalties of wirings arising.

Furthermore, in the above embodiment, the redundant circuit 56 includes a latch circuit and information regarding a defective line is latched in it. Therefore, reading data from the fuse circuit 51 only once after the semiconductor memory device being started enables to perform a redundant process continuously without reading the data again.

A second embodiment of the present invention will now be described.

Figure 5:
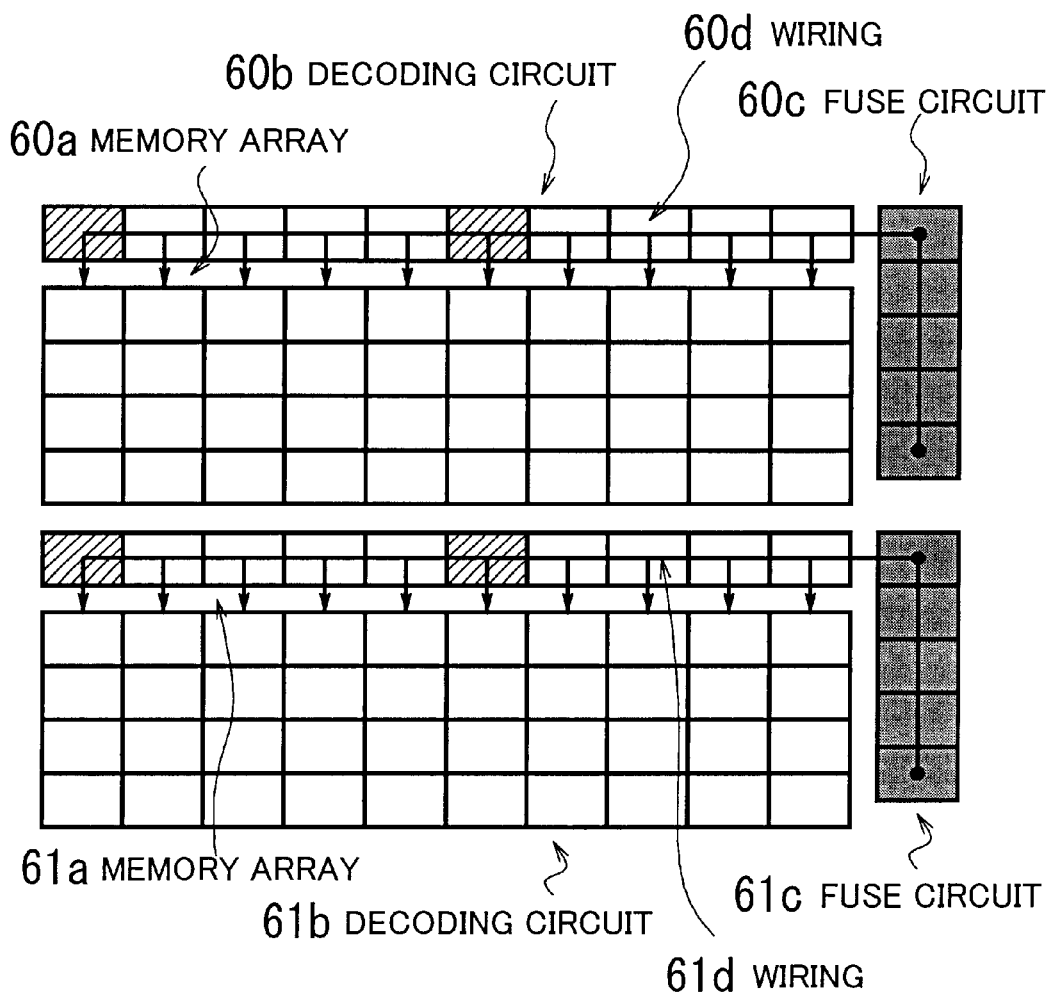
FIG. 5 is a view showing the structure of a second embodiment of the present invention.

FIG. 5 is a view for giving an overview of a second embodiment of the present invention. As shown in FIG. 5, a semiconductor memory device according to the second embodiment comprises memory arrays 60a and 61a, decoding circuits 60b and 61b, fuse circuits 60c and 61c, and wirings 60d and 61d.

The first through fifth columns from the left of the memory array 60a, decoding circuit 60b, fuse circuit 60c, and wiring 60d form a subblock and the sixth through tenth columns from the left of them form another one.

Moreover, the first through fifth columns from the left of the memory array 61a, decoding circuit 61b, fuse circuit 61c, and wiring 61d form a subblock and the sixth through tenth columns from the left of them form another one.

In this example, only four subblocks are shown to simplify descriptions, but in practice more than four subblocks can exist.

The memory arrays 60a and 61a include a plurality of memory cells arranged like a matrix.

The decoding circuits 60b and 61b include a decoding circuit and redundant decoding circuit (hatched area). These decoding circuits generate a selection signal by inputting and decoding an address signal and make a word line corresponding to the selection signal active. Each of these redundant decoding circuits reads information regarding a defective line stored in the fuse circuit 60c or 61c, decodes it, and performs a shift redundancy process.

The fuse circuits 60c and 61c include, for example, a fuse showing whether a defective line exists and a plurality of fuses showing the position of a defective line. The fuse circuit 60c is located very near to a side of the memory array 60a parallel to the word lines. The fuse circuit 61c is located very near to a side of the memory array 61a parallel to the word lines.

The wiring 60d connects the decoding circuit 60b with the fuse circuit 60c and transmits information between them. The wiring 61d connects the decoding circuit 61b with the fuse circuit 61c and transmits information between them.

Figure 6:
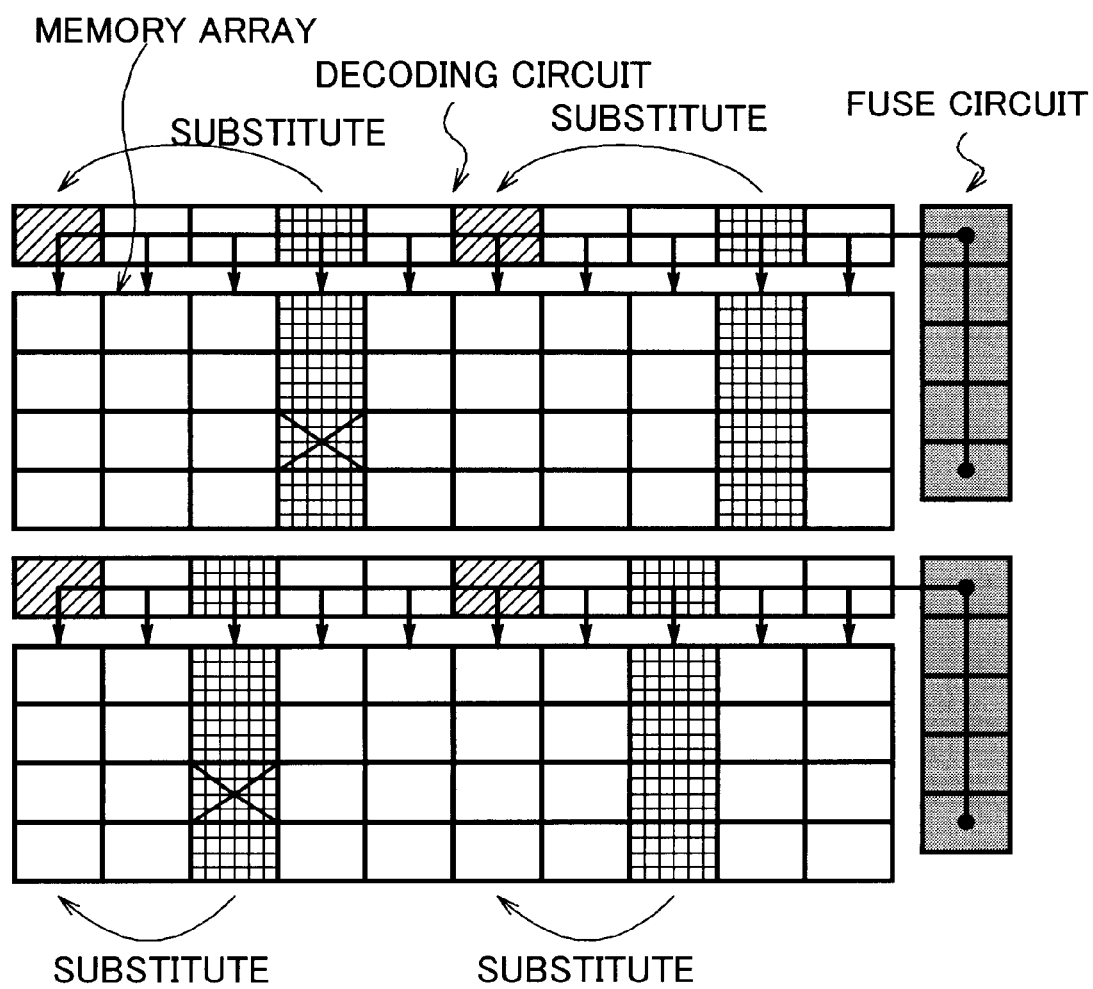
FIG. 6 is a view for describing operation in the second embodiment shown in FIG. 5.

FIG. 6 is a view for describing operation in the second embodiment shown in FIG. 5.

As shown in FIG. 6, in this embodiment, subblocks located in the vertical direction include different fuse circuits, but subblocks located in the horizontal direction share a fuse circuit. Shift redundancy in upper and lower subblocks therefore can be performed independently.

In FIG. 6, areas marked by the "X" indicate the faulty point. In this example, the faulty points exist in the fourth column from the left in the right subblock and the third column from the left in the left subblock.

It is assumed that the fourth column from the left in the right subblock in the upper memory array 60a is a defective line. Then in the right subblock, the leftmost redundant line is substituted for the defective line. In addition, the leftmost redundant line is substituted in the same way in the left subblock.

Moreover, it is assumed that the third column from the left in the left subblock in the memory array 60b is a defective line. Then in the left subblock, the leftmost redundant line is substituted for the defective line. In addition, the leftmost redundant line is substituted in the same way in the right subblock.

Figure 13:
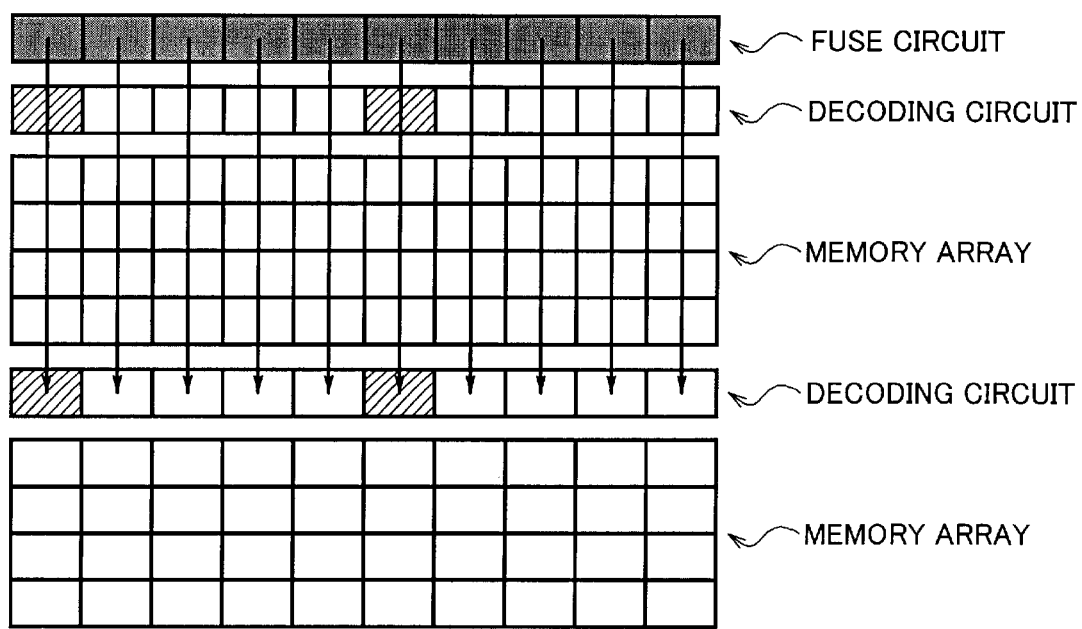
FIG. 13 is a view for describing an example of shift redundancy in a semiconductor memory device consisting a plurality of subblocks.
Figure 14:
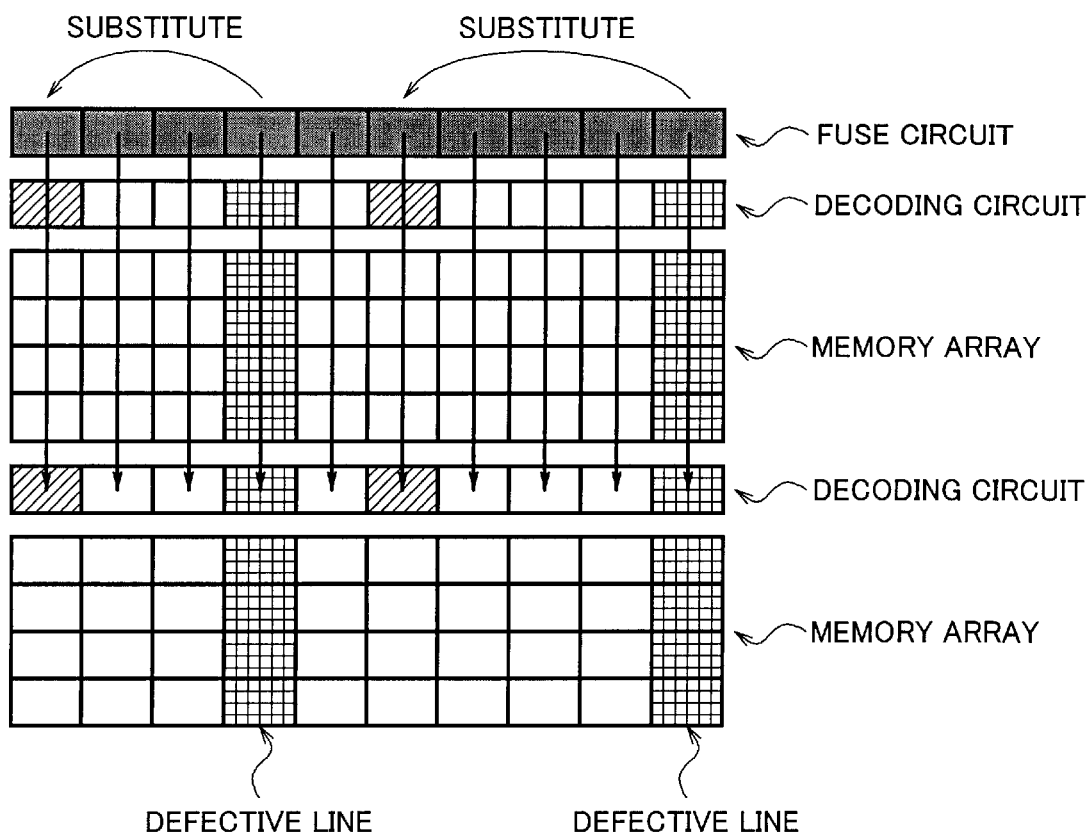
FIG. 14 is a view for describing an example of shift redundancy in a semiconductor memory device consisting a plurality of subblocks.

As stated above, subblocks located in the vertical direction include different fuse circuits, so there is no need to locate signal lines over memory cells (see FIG. 13). This enables to reduce the probability of the penalties of wirings arising.

In this example, subblocks located in the horizontal direction share a fuse circuit. However, they may include different fuse circuits.

Moreover, a fuse circuit is located very near to a side of a subblock parallel to the word lines. Therefore, even if a plurality of subblocks share a fuse circuit, for example, there is no need to locate wirings over a memory array. This enables to reduce the probability of the penalties of wirings arising.

A third embodiment of the present invention will now be described.

Figure 7:
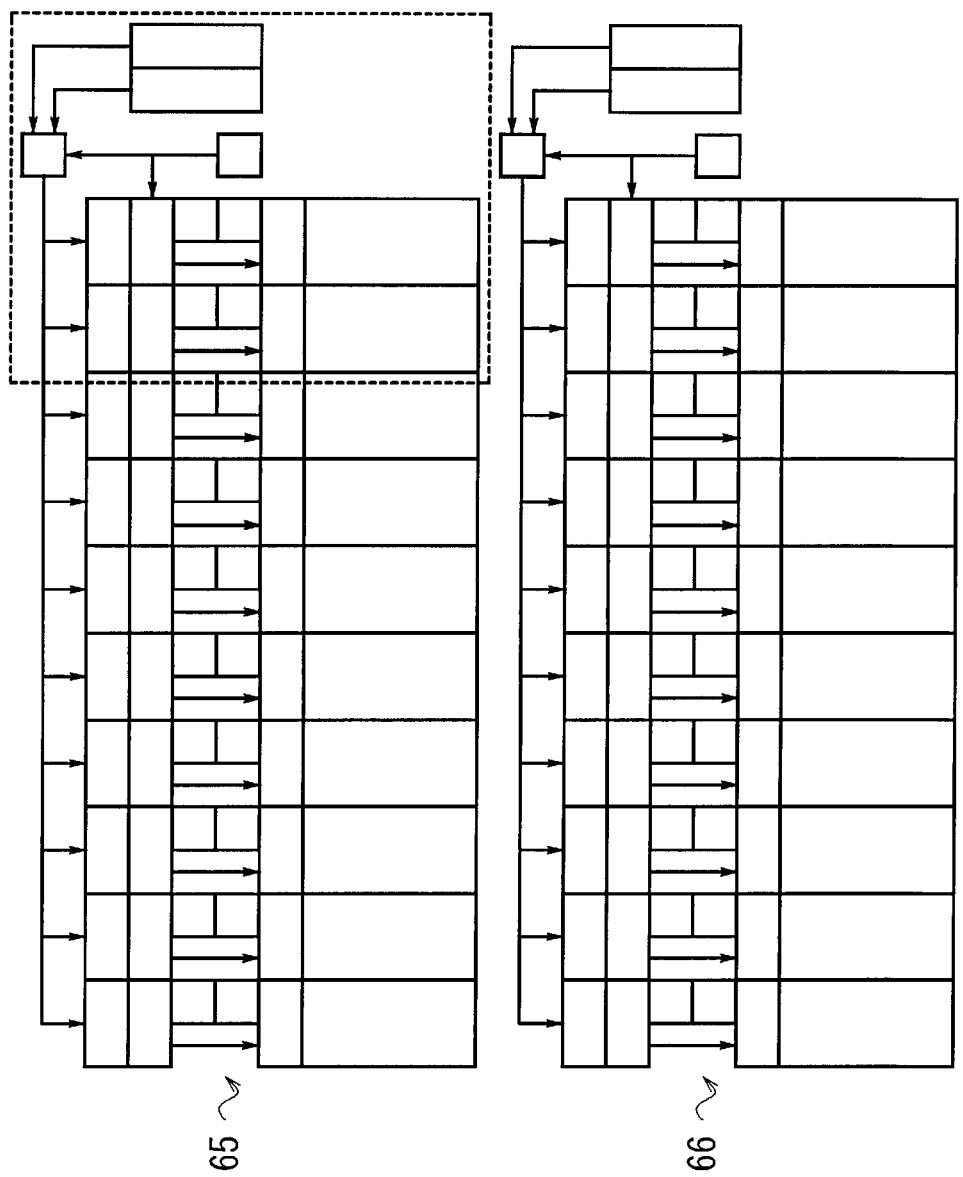
FIG. 7 is a view showing the structure of a third embodiment of the present invention.

FIG. 7 is a view showing the structure of a third embodiment of the present invention. The third embodiment is a synthesis of the first and second embodiments. In this example, a semiconductor memory device according to the third embodiment comprises a subblock 65 and subblock 66. As shown in FIG. 5, two or more subblocks may exist in the horizontal direction.

Figure 8:
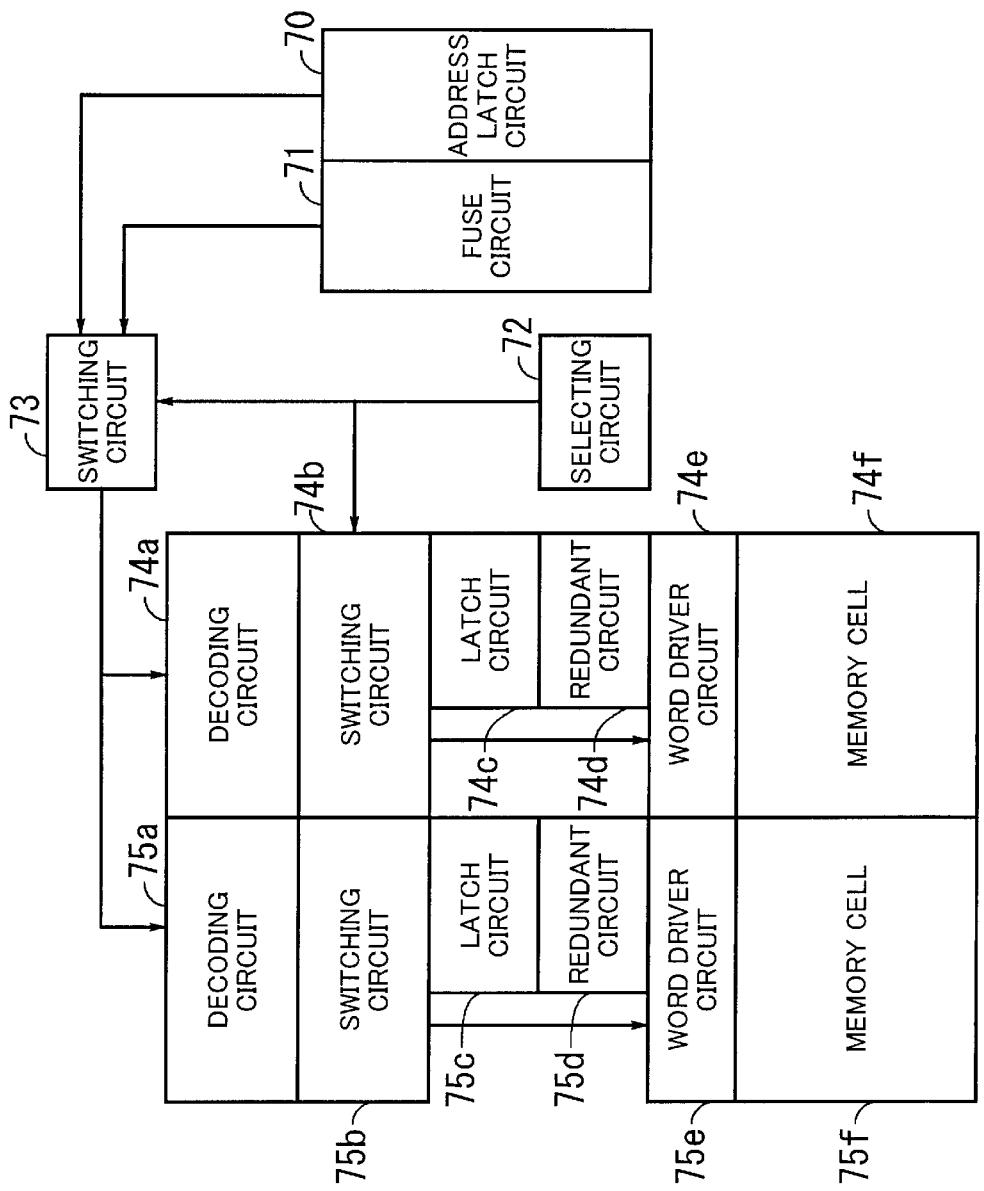
FIG. 8 is a view showing the detailed structure of an area enclosed with a dashed line in FIG. 7.
Figure 9:
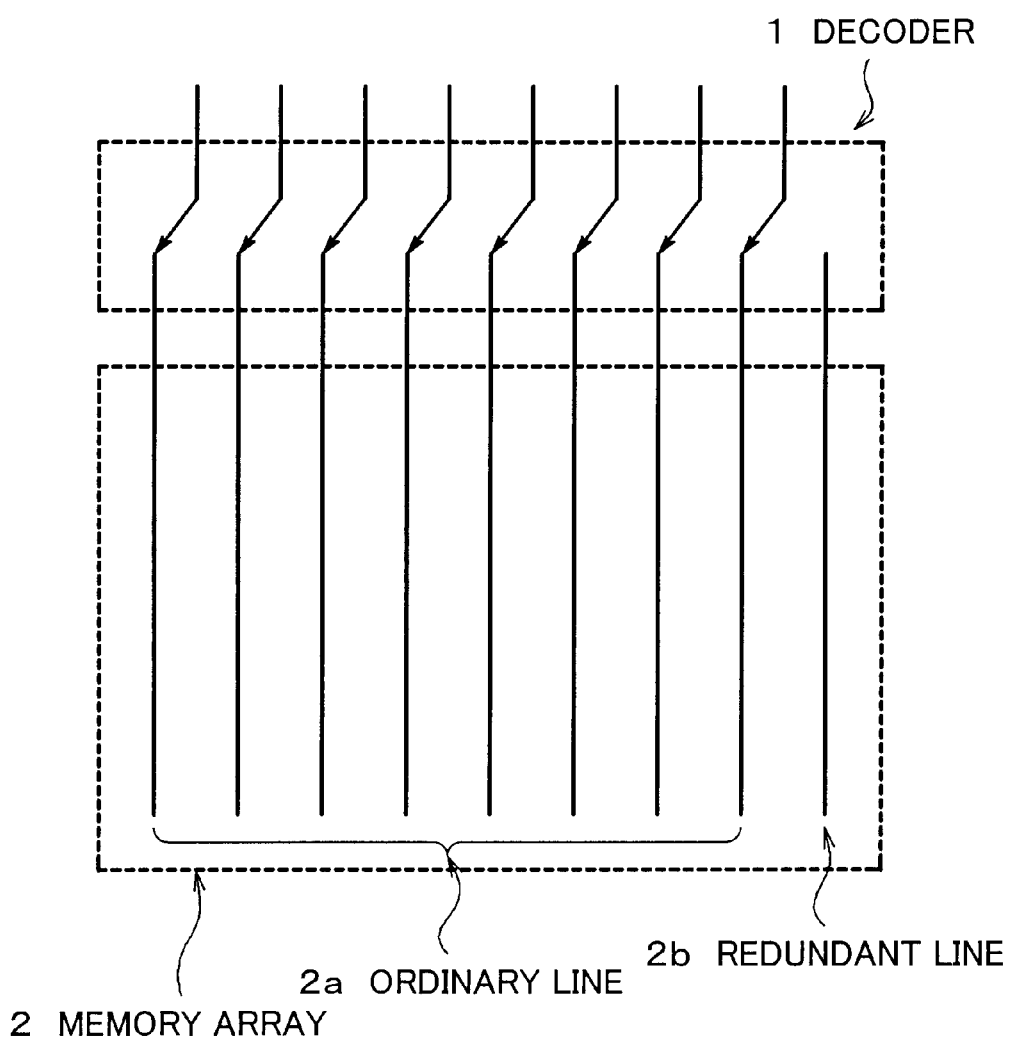
FIG. 9 is a view for giving an overview of conventional shift redundancy.
Figure 10:
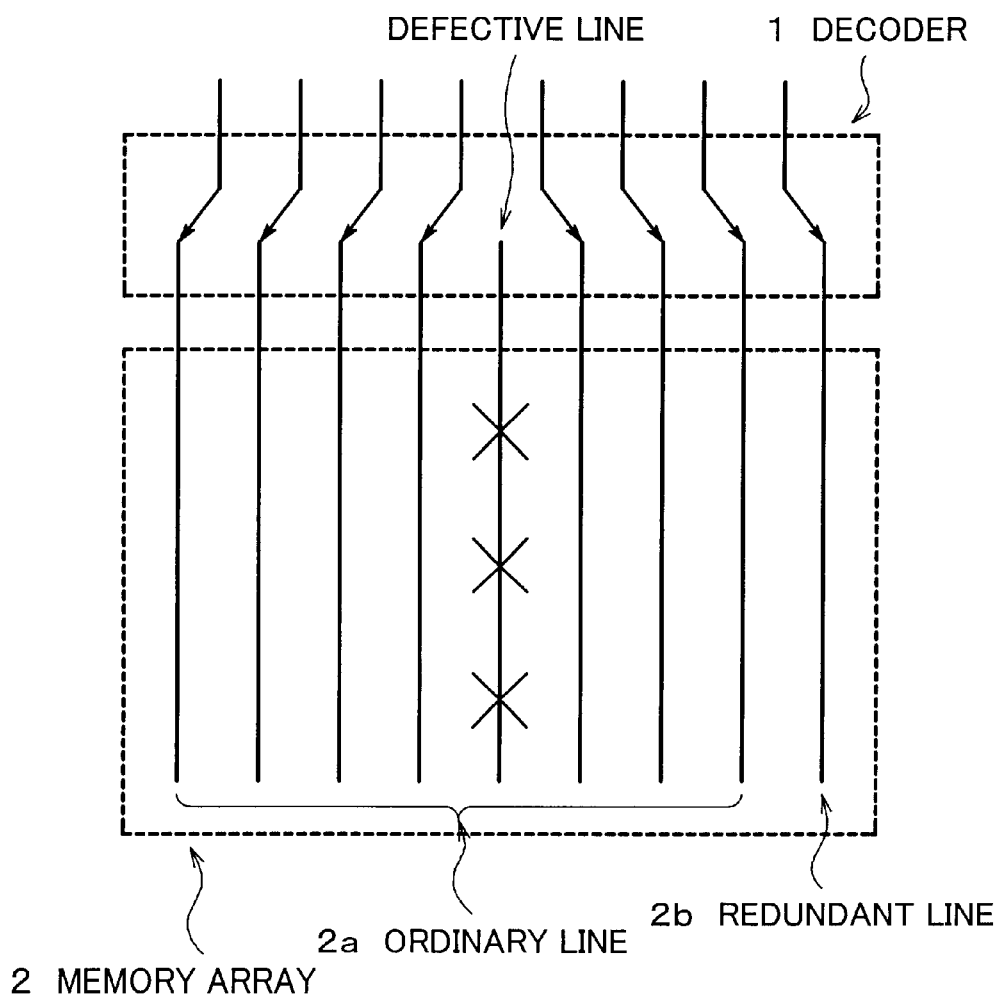
FIG. 10 is a view for giving an overview of conventional shift redundancy.
Figure 11:
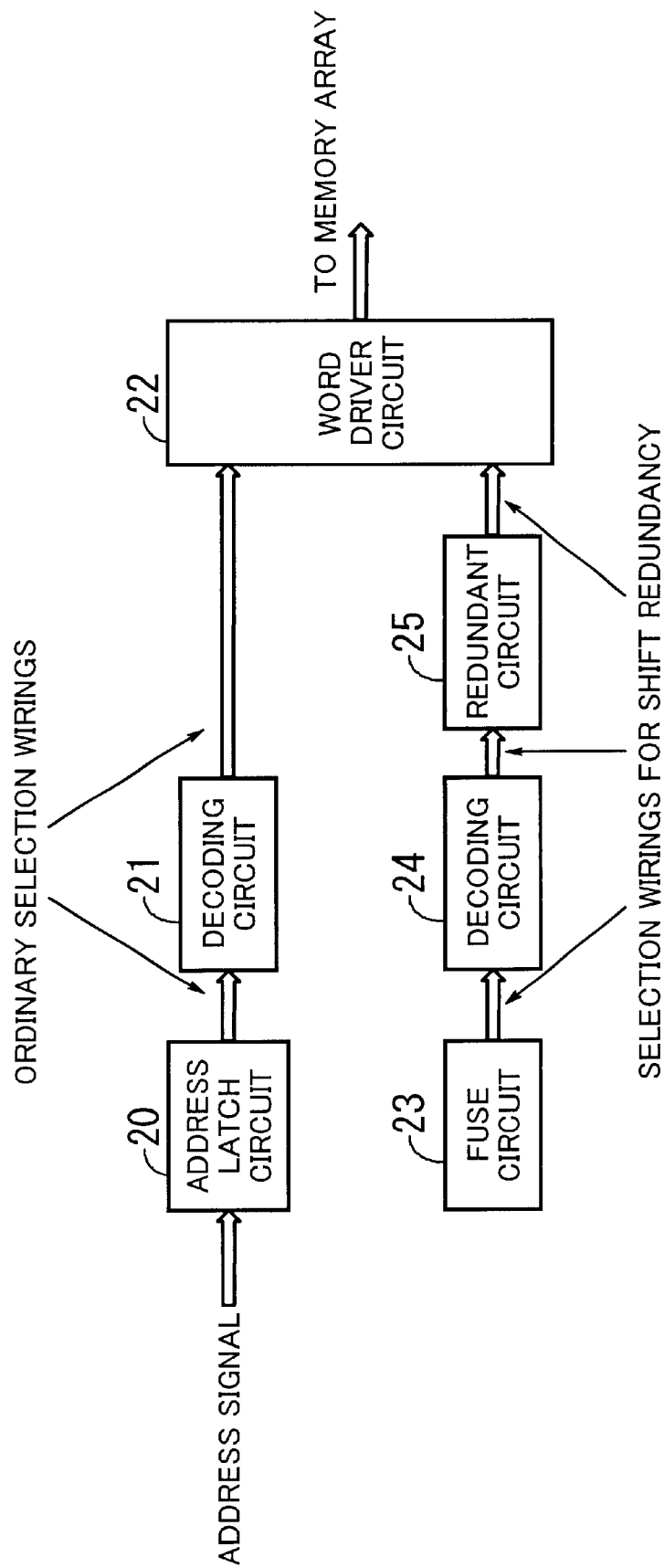
FIG. 11 is a view showing the structure of a conventional semiconductor memory device.
Figure 12:
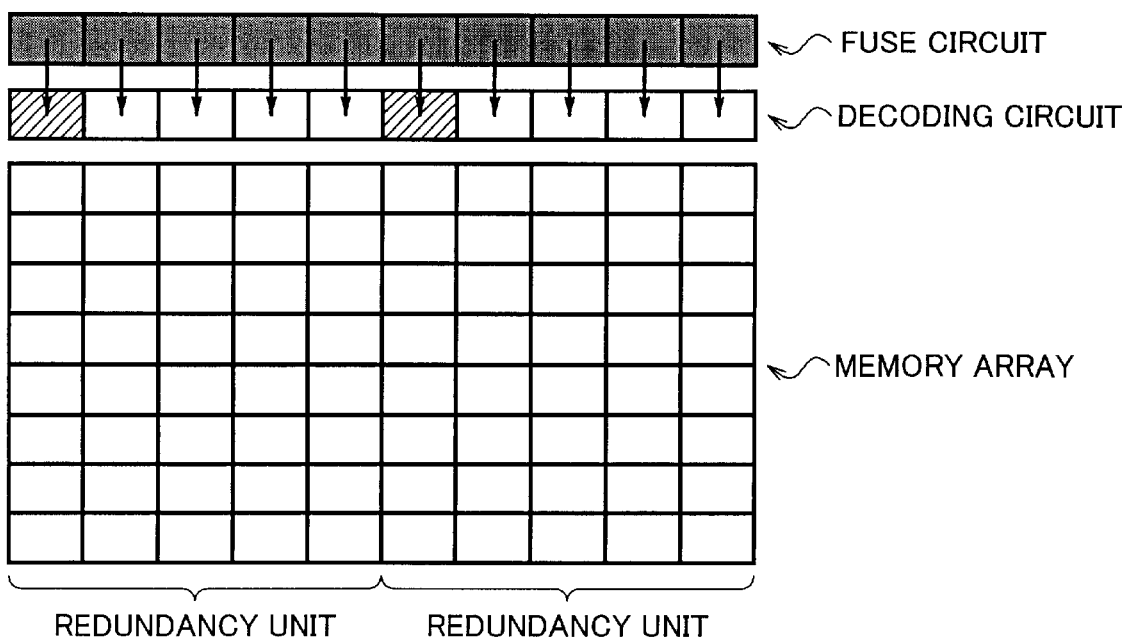
FIG. 12 is a view for giving an overview of a circuit pattern formed in the case of the circuit shown in FIG. 11 being mounted on a semiconductor substrate.

FIG. 8 is an enlarged view of an area enclosed with a dashed line in FIG. 7. In this example, the area includes an address latch circuit 70, a fuse circuit 71, a selecting circuit 72, a switching circuit 73, decoding circuits 74a and 75a, switching circuits 74b and 75b, latch circuits 74c and 75c, redundant circuits 74d and 75d, word driver circuits 74e and 75e, and memory cells 74f and 75f.

The address latch circuit 70, fuse circuit 71, selecting circuit 72, switching circuit 73, decoding circuits 74a and 75a, switching circuits 74b and 75b, redundant circuits 74d and 75d and word driver circuits 74e and 75e, and latch circuits 74c and 75c correspond to the address latch circuit 50, fuse circuit 51, selecting circuit 53, switching circuit 52, decoding circuit 54, switching circuit 55, word driver circuit 57, and redundant circuit 56 respectively.

The address latch circuit 70 is located very near to a side of the subblock 65 parallel to the word lines. The address latch circuit 70 latches an address signal supplied from the outside and provides it to the switching circuit 73.

The fuse circuit 71 is located very near to a side of the subblock 65 parallel to the word lines. This is the same with the address latch circuit 70. The fuse circuit 71 includes a plurality of fuses. Information showing whether a defective line exists and information for specifying a defective line (if it exists) are held by these fuses.

The switching circuit 73 is located so that wirings from the decoding circuits 74a and 75a will be straight. The switching circuit 73 selects output from the address latch circuit 70 or output from the fuse circuit 71 under the control of the selecting circuit 72 and provides it to the decoding circuits 74a and 75a.

At the time of the semiconductor memory device being started, the selecting circuit 72 provides a signal that instructs to select output from the fuse circuit 71 to the switching circuit 73 and switching circuits 74b and 75b. After a redundant process is completed, the selecting circuit 72 provides a signal that instructs to select output from the address latch circuit 70 to the switching circuit 73 and switching circuits 74b and 75b.

The decoding circuits 74a and 75a are located at the top of the subblock 65. The decoding circuits 74a and 75a decode an address signal supplied from the address latch circuit 70 or fuse circuit 71, generate a selection signal for selecting a word line, and output it.

The switching circuits 74b and 75b are located under the decoding circuits 74a and 75a respectively. The switching circuit 74b provides output from the decoding circuit 74a to the word driver circuit 74e or latch circuit 74c in compliance with instructions given by the selecting circuit 72. The switching circuit 75b provides output from the decoding circuit 75a to the word driver circuit 75e or latch circuit 75c in compliance with instructions given by the selecting circuit 72.

The latch circuits 74c and 75c are located under the switching circuits 74b and 75b respectively. The latch circuits 74c and 75c latch and store information supplied from the fuse circuit 71 and provide it to the redundant circuits 74d and 75d respectively.

The word driver circuits 74e and 75e are located under the redundant circuits 74d and 75d respectively. The word driver circuits 74e and 75e perform a redundant process on the basis of information latched by the latch circuits 74c and 75c respectively.

The memory cells 74f and 75f are formed by arranging a plurality of memory elements in the vertical direction.

Now, operation in the above embodiment will be described.

If tests etc. before shipping show that there is a defective line in one of the memory cells 74f, 75f, and so on, a predetermined fuse in the fuse circuit 71 corresponding to the position of the defective line will be blown. The work of blowing a fuse will be performed according to subblocks.

The fuse circuit 71 includes a fuse showing whether there exists a defective line and a group of fuses for specifying the address of a defective line in a memory array. If a defective line is detected, then the above word line showing whether there exists a defective line is blown and the above group of fuses are blown according to the position of the defective line. This is the same with the above case.

In this state of things, it is assumed that the semiconductor memory device is mounted in a predetermined circuit and that power is applied to that circuit. Then a selecting circuit in each subblock gives instructions to select output from the fuse circuit. In the example shown in FIG. 8, for example, the selecting circuit 72 instructs the switching circuit 73 and switching circuits 74b and 75b to select output from the fuse circuit 71.

As a result, output from the fuse circuit 71 is selected by the switching circuit 73 and is provided to the decoding circuits 74a and 75a. The decoding circuit 74a decodes the output from the fuse circuit 71 to convert into a selection signal, which is supplied to the latch circuit 74c by the switching circuit 74b. The decoding circuit 75a decodes the output from the fuse circuit 71 to convert into a selection signal, which is supplied to the latch circuit 75c by the switching circuit 75b.

The latch circuit 74c latches and holds the information supplied from the switching circuit 74b and provides it to the redundant circuit 74d. The latch circuit 75c latches and holds the information supplied from the switching circuit 75b and provides it to the redundant circuit 75d.

The redundant circuit 74d latches and holds the selection signal for redundancy supplied from the switching circuit 74b. The redundant circuit 75d latches and holds the selection signal for redundancy supplied from the switching circuit 75b. The information latched in this way will remain held until power is turned off.

After the selection signals are provided to the redundant circuits 74d and 75d, the selecting circuit 72 instructs the switching circuit 73 and switching circuits 74b and 75b to select output from the address latch circuit 70.

As a result, the address latch circuit 70 latches an address signal supplied from the outside and provides it to the decoding circuits 74a and 75a via the switching circuit 73.

The decoding circuit 74a and 75a decode the address signal to generate a selection signal and output it to the switching circuits 74b and 75b respectively.

The switching circuit 74b provides the output from the decoding circuit 74a to the word driver circuit 74e in compliance with instructions from the selecting circuit 72. The switching circuit 75b provides the output from the decoding circuit 75a to the word driver circuit 75e in compliance with instructions from the selecting circuit 72.

By the way, the word driver circuits 74e and 75e have performed a redundant process under the control of the redundant circuits 74d and 75d respectively. Another line therefore has been substituted for the defective line. As a result, if a selection signal that selects the defective line is input, the substitute line for the defective one will be accessed. To be concrete, if the memory cell 74f is a defective line and a request to access the memory cell 74f is made, another line, that is to say, another memory cell (not shown) will be accessed.

As described above, in the present invention, subblocks located in the direction parallel to the word lines (in the vertical direction) include different fuse circuits and are controlled independently of each other. Therefore, there is no need to locate wirings over memory cells (see FIG. 13) and the penalties of wirings can be prevented from arising.

Moreover, wirings which transmit an address signal also transmit redundancy information. The penalties of wirings therefore can be prevented from arising by reducing the number of wirings. This is the same with the above case.

Furthermore, a latch circuit is included and information regarding a defective line is latched in it. Therefore, reading data from a fuse circuit only once after a semiconductor memory device being started enables to perform a redundant process continuously without reading the data again.

In the above embodiment, each subblock includes an independent fuse circuit. However, a plurality of subblocks located in the direction perpendicular to word lines may share a fuse circuit. In that case, wirings should be located outside a memory array. That is to say, unlike conventional semiconductor memory devices, there is no need to locate wirings over a memory array. Even such a structure therefore enables to prevent the penalties of wirings from arising.

If wirings of a spread type, for example, are formed in subblocks located in the direction parallel to word lines, the wirings which do not pass over memory cells can be formed. This can prevent the penalties of wirings from arising. As described above, in this case, the number of subblocks located in the vertical direction which can be controlled without wirings passing over word lines is two at the most.

Furthermore, in the above embodiments, a redundant process on a word line has been described as an example. It is, however, a matter of course that the present invention is applicable not only to word lines but also to column lines etc.

Finally each circuit described above is a simple example. It is a matter of course that the present invention is not limited to such cases.

As has been described in the foregoing, a semiconductor memory device having a shift redundancy function, according to the present invention, comprises an address input circuit for receiving an address signal input, a drive circuit for driving a memory array in compliance with the address signal, a signal line for connecting the address input circuit and the drive circuit, a redundant circuit located near the drive circuit for substituting other lines including a redundant line for a defective line in the memory array, a defective line information store circuit for storing information showing the defective line, and a supply circuit for supplying information stored in the defective line information store circuit to the redundant circuit via the signal line. This can reduce the number of signal lines needed, resulting in a lower probability of the penalties of wirings arising.

Furthermore, a semiconductor memory device with a plurality of subblocks each including a drive circuit and memory array comprises a defective line information store circuit for storing information showing defective lines in the plurality of subblocks according to subblocks and a redundant circuit for substituting other lines including a redundant line for a defective line in each of the plurality of subblocks on the basis of information stored in the defective line information store circuit. This can eliminate wirings over a subblock, resulting in a lower probability of the penalties of wirings arising.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor memory device having a shift redundancy function, the device comprising:

an address input circuit for receiving an address signal input;

a drive circuit for driving a memory array in compliance with the address signal;

a signal line for connecting the address input circuit and the drive circuit;

a redundant circuit located near the drive circuit for substituting other lines including a redundant line for a defective line in the memory array;

a defective line information store circuit for storing information showing the defective line; and a supply circuit for supplying information stored in the defective line information store circuit to the redundant circuit via the signal line, wherein the redundant circuit includes a storage circuit for storing the information.

2. The semiconductor memory device according to claim 1, wherein the supply circuit supplies information showing the defective line to the redundant circuit via the signal line when the semiconductor memory device is started.

* * * * *